(12) United States Patent
Krenzer

(10) Patent No.: US 10,055,513 B2
(45) Date of Patent: Aug. 21, 2018

(54) DEVELOPMENT DEVICE FOR CONFIGURING A MODEL OF A TECHNICAL SYSTEM TO REPRESENT SIGNAL PATHS

(71) Applicant: dSPACE digital signal processing and control engineering GmbH, Paderborn (DE)

(72) Inventor: Egon Krenzer, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 1002 days.

(21) Appl. No.: 14/495,460

(22) Filed: Sep. 24, 2014

(65) Prior Publication Data

US 2015/0142401 A1  May 21, 2015

(30) Foreign Application Priority Data

Nov. 18, 2013 (DE) .......... 10 2013 223 467

(51) Int. Cl.
| | | |
|---|---|---|
| *G06F 17/50* | (2006.01) | |
| *G06F 3/048* | (2013.01) | |
| *G06F 8/10* | (2018.01) | |

(52) U.S. Cl.
CPC .............. *G06F 17/50* (2013.01); *G06F 3/048* (2013.01); *G06F 8/10* (2013.01); *G06F 17/5022* (2013.01); *G06F 17/5045* (2013.01); *G06F 2203/04804* (2013.01)

(58) Field of Classification Search
CPC ...................................................... G06F 17/50
See application file for complete search history.

(56) References Cited

U.S. PATENT DOCUMENTS

| 7,665,025 B2 | 2/2010 | Feng et al. |
| 7,900,191 B1 | 3/2011 | Raghavan |
| 7,975,235 B2 | 7/2011 | Feng et al. |
| 8,122,354 B1 | 2/2012 | Torgerson |
| 2002/0178425 A1* | 11/2002 | Abe .................. G01R 31/31835 716/106 |
| 2004/0210831 A1 | 10/2004 | Feng et al. |

(Continued)

OTHER PUBLICATIONS

National Instruments, "Global Variable from Control and Simulation" (Feb. 27, 2012), pp. 1-7 [retrieved from https://forums.ni.com/t5/LabVIEW/Global-Variable-from-Control-and-simulation/td-p/1892967].*

(Continued)

*Primary Examiner* — Brian W Wathen
(74) *Attorney, Agent, or Firm* — Muncy, Geissler, Olds & Lowe, P.C.

(57) ABSTRACT

A development device for configuring a model of a technical system to represent signal paths, in particular on a computer with a display, wherein the model depicts at least two signal paths of the technical system and, in an initial representation, all input signals, output signals, and all processing units are depicted in the form of block elements in a circuit diagram, characterized in that the development device is configured to reduce the representation of the model to the signal path of the selected signal once any desired input signal or output signal has been selected, wherein only the relevant processing units are displayed or highlighted.

10 Claims, 6 Drawing Sheets

(56) References Cited

U.S. PATENT DOCUMENTS

2007/0271499 A1* 11/2007 Feng .................. G06F 17/5009
715/209
2011/0191742 A1* 8/2011 Oberai .................. G06F 17/50
716/136
2012/0117530 A1* 5/2012 Green ................. G06F 17/5045
716/139

OTHER PUBLICATIONS

European Search Report for European Application No. 14153375.2 dated Mar. 25, 2014 with English translation.
"Displaying Signal Sources and Destinations" The Mathworks Inc., http://www.mathworks.com/help/simulink/ug/displaying_signal_sources_and_destinations.html, p. 1 (2012).

* cited by examiner

_US 10,055,513 B2_

DEVELOPMENT DEVICE FOR CONFIGURING A MODEL OF A TECHNICAL SYSTEM TO REPRESENT SIGNAL PATHS

This nonprovisional application claims priority under 35 U.S.C. § 119(a) to German Patent Application No. 10 2013 223 467.8, which was filed in Germany on Nov. 18, 2013, and which is herein incorporated by reference.

BACKGROUND OF THE INVENTION

Field of the Invention

The invention relates to a development device for configuring a model of a technical system to represent signal paths, in particular for configuring a model of a technical system on a computer with a display, wherein the model depicts at least two signal paths of the technical system and, in an initial representation, all input signals, output signals, and all processing units, and hence variables that influence the output signals, are depicted in the form of block elements in a circuit diagram.

Within the scope of the present invention, the term 'development device' can be understood to be a device by means of which a user, which is to say a person using the device, for example, can depict a graphical model of a technical system and configure it in accordance with the task at hand.

An input signal can be understood within the scope of this invention as the signal that is converted through processing by a processing unit into an output signal. It is not necessarily the first signal in a processing chain. Thus, the output signal of one processing module of a first subsection of a complete signal path can constitute the input signal of a subsequent processing module of a second subsection of the complete signal path. The input signal is accordingly characterized in that it is transformed into an output signal by processing in a processing unit, hence there is a chronological sequence in the signal processing.

Description of the Background Art

The signal paths in graphical models generally have a quite complex structure, so that it can become confusing for the user to determine which influencing variables act on the individual signals, and where they are located in the graphical model. Oftentimes a hierarchical representation is selected, where the rough structure of the technical system is represented on a topmost level and detail views for specific blocks within the system can be selected by selecting the applicable lower levels.

In programs such as MATLAB/Simulink, it is possible to trace a signal path back to its source within a graphical model using the options "Highlight to source" or "Highlight to destination," in that the representation of the signal path in the display is highlighted to its source. Only the output of the last processing unit that has been passed through is viewed as the source in this context.

SUMMARY OF THE INVENTION

It is thus an object of the present invention to provide a development device and an improved method for representing a model of a technical system that allows easy-to-understand access to a complex model for a user.

The object is attained in an embodiment by a development device of the initially mentioned type, whereby the development device is configured to reduce the representation of the model to the signal path of the selected signal once any desired input signal or output signal has been selected, wherein only the relevant processing units are displayed or highlighted.

The complexity of modern technical systems is continually increasing. When these systems are depicted in graphical models, this can have the result that the depicted system as a whole has a structure that is so complex that tracing individual signal paths on the screen demands the utmost concentration for the user to be able to correctly determine which of the depicted processing units actually influence a certain signal. However, in order to be able to evaluate whether a certain processing unit or another signal influence a given signal, an observer must cognitively grasp each individual processing unit and each individual signal, even when it afterwards turns out that a processing unit or a signal is completely irrelevant to the signal of interest.

A significant advantage of the system is that the user is given the capability of selecting a particular signal for which all processing units, and hence influencing variables, along the signal path are identified. In this context, visual highlighting within the system as a whole can be especially advantageous, since the display of the model in the background continues to allow the applicable signal to be placed within the context of the system as a whole. The user can select any desired signals for signal path analysis in this context: one or more output signals within a system; one or more input signals and output signals; and/or one or more input signals within a system When an output signal is selected, all input signals that enter into the generation of the output signal are displayed and/or visually highlighted, as well as all processing units that are passed through on the signal path, and thus all influencing variables. Or, viewed the other way around: only the signals and processing units that do not influence the selected output signal at all are computed out of the representation, and hence removed from the display or placed in the background visually (e.g., by being represented in reduced opacity). Through selection of an input signal, it is possible to easily ascertain which output signals depend on the selected input signal and which processing units the input signal passes through. With the aid of the reduced model view represented in accordance with the invention, analysis of the resultant circuit diagram/system model is made significantly easier for the user, and a search for, e.g., problems that arise can take place substantially more efficiently.

In an embodiment of the development device according to the invention, the model has a plurality of hierarchical levels, wherein the development device makes a specific number of levels selectable for the representation of the technical system. All signal paths can be displayed on a topmost level in this context, with individual model processing units through which signals pass being schematically represented as function blocks. In a lower level, these function blocks can then be displayed in greater detail, with the processing units listed in this level also being capable of having further sub-processing units, which in turn are represented by a single function block. As a general rule, the number of levels is not limited here, and is based on the complexity of the depicted model.

According to an embodiment, in the case of reduced representation of the model to the selected signal path, all relevant processing units can be represented in a predetermined level. This allows for a reduction in the complexity of the model with simultaneous representation of the desired level of detail, which is accomplished through the selection of the level.

According to another embodiment, the development device can be additionally configured to display one or more signal profiles of a given signal along a signal path within the depicted system.

The signal profiles can be generated by the means that precisely the signals along the path are recorded in the course of simulations of the system or parts thereof in different simulation modes (Model-in-the-Loop, Software-in-the-Loop, Processor-in-the-Loop or MIL, SIL, PIL). The signal profiles can then be displayed in the circuit diagram/model of the system next to the applicable processing unit, or else can be overlaid on the display device when a pointer is passed over the processing unit using a control device, for example a mouse, or in reaction to a control command that can be entered through a keyboard or other input device. Alternatively, a parallel display of the individual signal profiles is also possible, for example in a separate window.

The functionality is available in the overall representation as well as in the representation reduced to a selected signal. Especially in the case of the latter representation, the user can concentrate on individual signal dependencies a section at a time when analyzing the behavior of the system instead of having to navigate through a maze of signals.

According to another embodiment, each of the development devices of the preceding embodiments is additionally configured to reduce the representation of the model to simple lines and an indication of a number of the processing units through which the signal passes along the selected signal path.

According to another embodiment, each of the development devices of the preceding embodiments is additionally configured to ascertain and indicate the degree of influence of an input signal on an output signal.

In order to ascertain the degree of influence of individual input signals on output signals, a user can carry out a complete simulation (MIL/SIL/PIL) in the original system and store the signal profiles ascertained in so doing. Then he can extract the system, which is to say select the signal paths that are relevant to him. After this selection, the influence of an input signal on an output signal can then be ascertained on the basis of the signal profiles.

Alternatively, to ascertain the degree of influence of individual input signals on output signals, a function can be selected that automatically extracts the selected part of the signal path and supplies the inputs with stimulus signals in order to feed signals in. MIL/SIL/PIL simulations are then carried out for this extracted system, and in this way the average difference quotient $\Delta Output/\Delta Input\_i$ is estimated, which is considered the "degree of influence" of Input_i on the output signal Output.

Regardless of the method of determination, a further possibility for limitation exists in the MIL/SIL/PIL simulation. The user can define the start and the end point of the calculation of the degree of influence from a complete, executed simulation run. Thus, the user can investigate the following scenarios in detail: degree of influence of the input signals during the transient response; degree of influence of the input signals of the system after the transient response; and/or degree of influence of the input signals when a certain problem exists in the system According to an embodiment, specification of the degree of influence can be accomplished by appropriate configuration of an applicable signal path, in particular through an appropriate color configuration of the signal path or an appropriate line width.

According to an embodiment, specification of the degree of influence can be accomplished by appropriate percentage specification at an applicable signal path.

The development device permits refactoring of the model, which is to say a user can perform the various operations on the complete signal path or on a part of the signal path.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
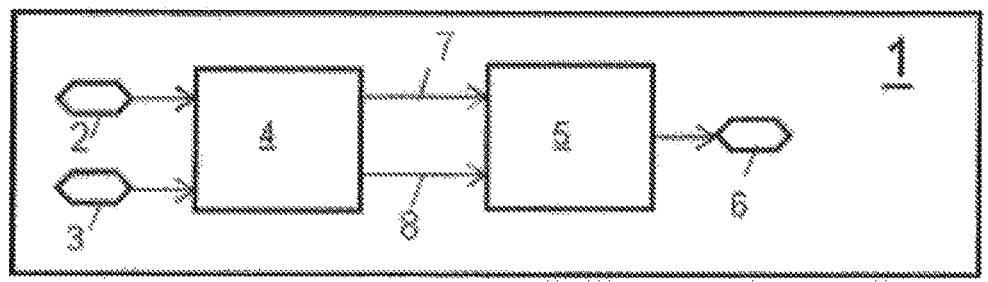
FIG. 1 shows the topmost hierarchy level of a model component of a preferred embodiment.
Figure 2:
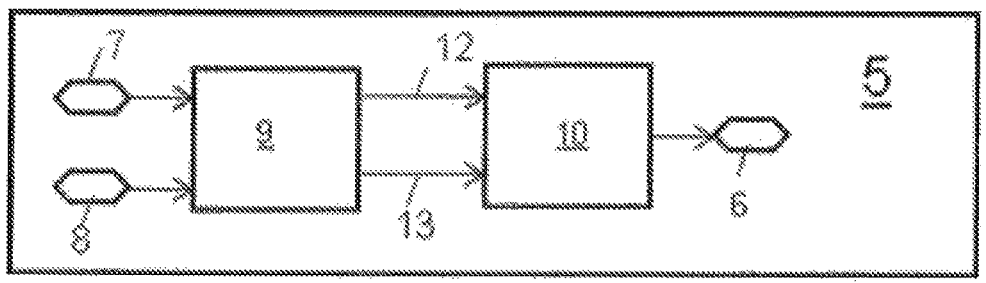
FIG. 2 shows the subcomponent 5 from FIG. 1 in a detail view at a lower hierarchy level.
Figure 3:
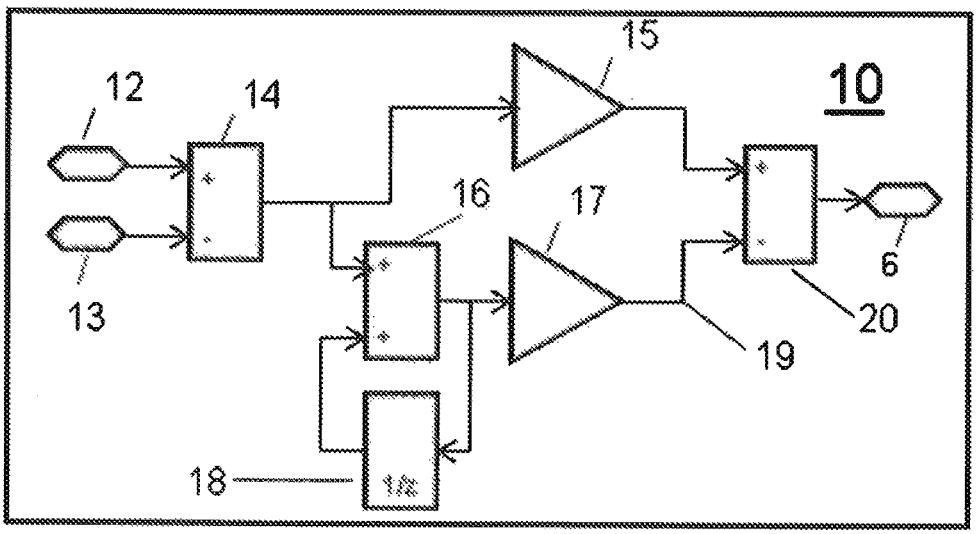
FIG. 3 shows the subcomponent 10 from FIG. 2 in another detail view at a lower hierarchy level.

FIGS. 1-3 show a graphical representation of a technical system according to a preferred embodiment of the present invention. The depicted system is subdivided into three hierarchy levels, with FIG. 1 showing the topmost hierarchy level in the form of block 1. The input signals 2 and 3 pass through function block 4 here, and are passed on to function block 5 as signals 7 and 8, respectively. They are processed further there, and ultimately are output as output signal 6.

Function block 5 is shown in detail in FIG. 2, and constitutes a second hierarchy level located below the hierarchy level of block 1. The signals 7 and 8 received by function block 5 are routed through function block 9 to function block 10 as signals 12 and 13 for further processing. The output signal 6 is output by function block 10 after processing. Function block 9 can be, for example, a linearization circuit, while function block 10 could represent a controller, for example.

Figure 4:
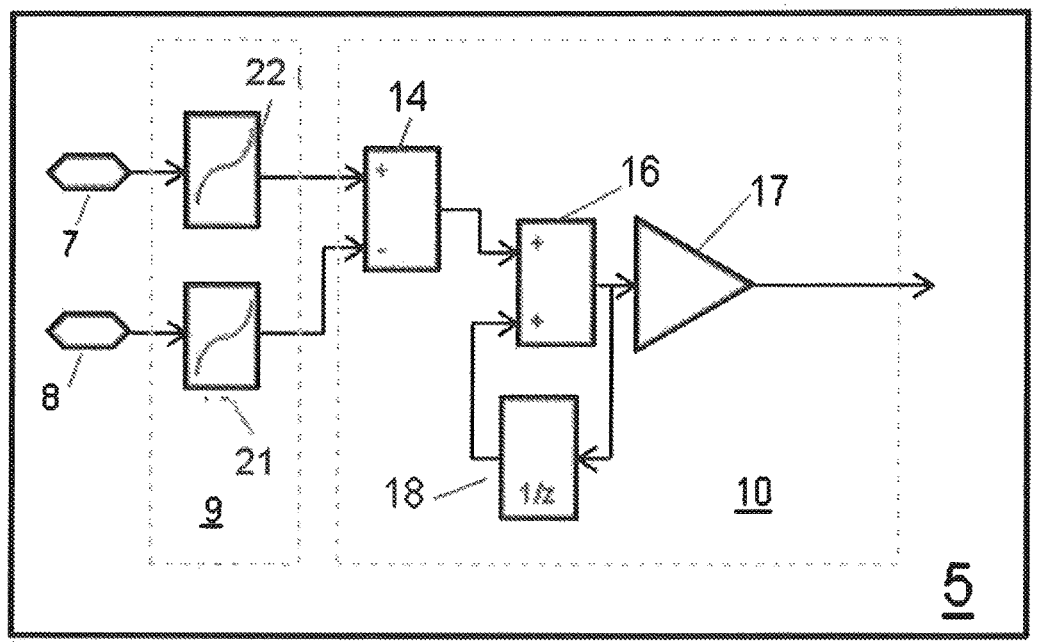
FIG. 4 shows a preferred embodiment of the present invention, in which the blocks influencing a particular signal are represented in a single hierarchy level.

A more detailed representation of function block 10 is given in FIG. 3, which shows an additional hierarchy level below the hierarchy level shown in FIG. 2. The signals 12 and 13, which are routed from function block 9 to function block 10, pass through the depicted processing units 14-18, before function block 20 outputs the final output signal 6. According to the invention, the user of the development device can select any desired signal within the represented system and, specifying an appropriate hierarchy level, can cause all the processing units that are relevant to the signal to be displayed in the selected hierarchy level. FIG. 4 shows such a representation for the signal 19 according to the embodiment from FIGS. 1-3 on the hierarchy level of FIG. 2. The relevant input signals on this hierarchy level comprise the signals 7 and 8, each of which passes through the function unit 9, which here performs, for example, linearization of the signals by the processing units 21 and 22. Any other form of signal processing is possible in this location. By way of example, the output signals of the processing units 21 and 22 are then forwarded to the summation block 14, which subtracts the second input signal from the first input signal.

Figure 5:
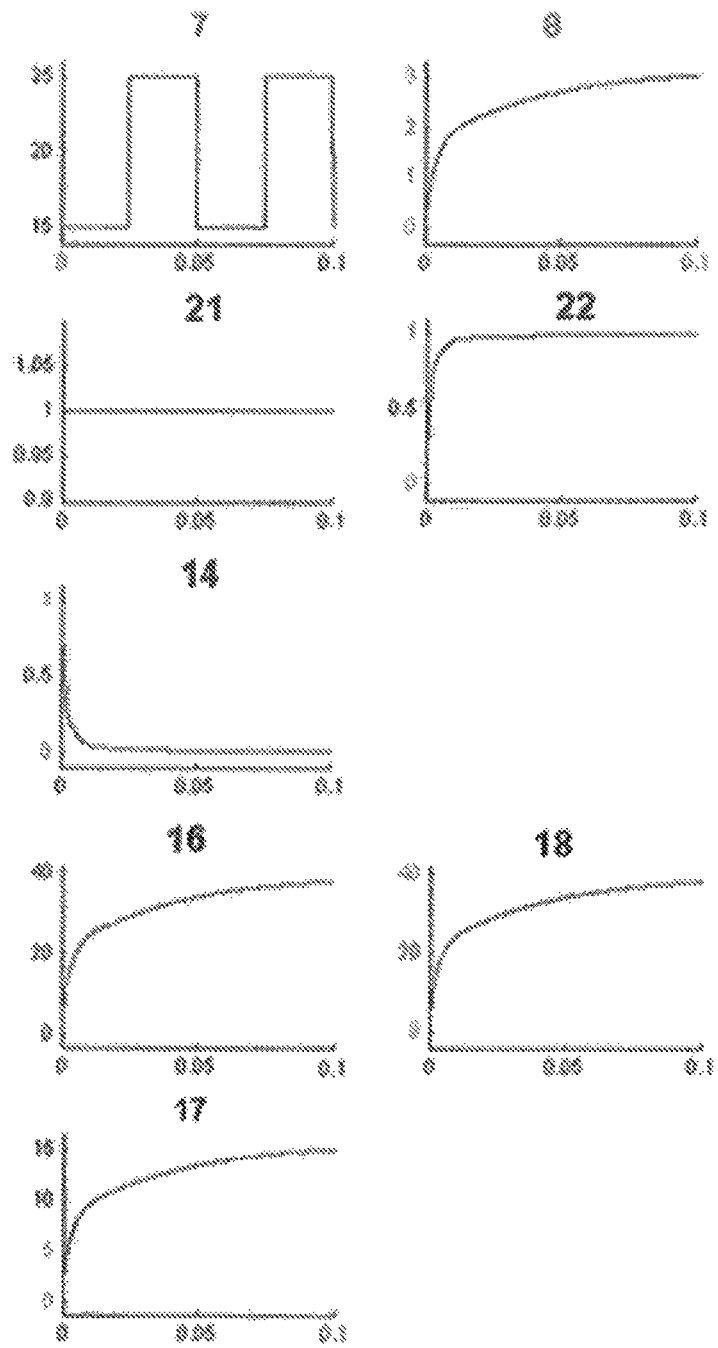
FIG. 5 shows the signal profiles of the input signals of the embodiment from FIGS. 1-4 and the signal profiles at each of the processing units from FIG. 4.

FIG. 5 shows the signal profiles at various points of the model. Shown in the topmost row are two exemplary input signal profiles for the signals 7 and 8 from FIG. 4. These signals are processed by the processing units 21 and 22: in the example here, a linearization is carried out so that the signal profiles of the input signals 7 and 8 then appear as in the corresponding diagrams 21 and 22 in the second line of FIG. 5 after passage through the processing units 21 and 22. The two signals are fed into the processing unit 14 whose output signal has the signal profile shown in the third line. From there, the signal is either forwarded through the processing unit 16 directly to the processing unit 17 or is fed back through the processing unit 18 to the processing unit 16. The corresponding signal profiles after passage through the applicable processing unit are shown in the next-to-last and last lines of FIG. 5. The display of the signal profiles for each processing unit allows for an efficient and easy-to-understand analysis of the system, for troubleshooting purposes and also to support comprehension of the system as a whole and possible changes thereto. The charts can be displayed in the circuit diagram next to the relevant processing unit, or on the display device when a pointer is passed over the processing unit using a control device, for example a mouse, or in response to a control command that can be entered through a keyboard or other input device.

Figure 6:
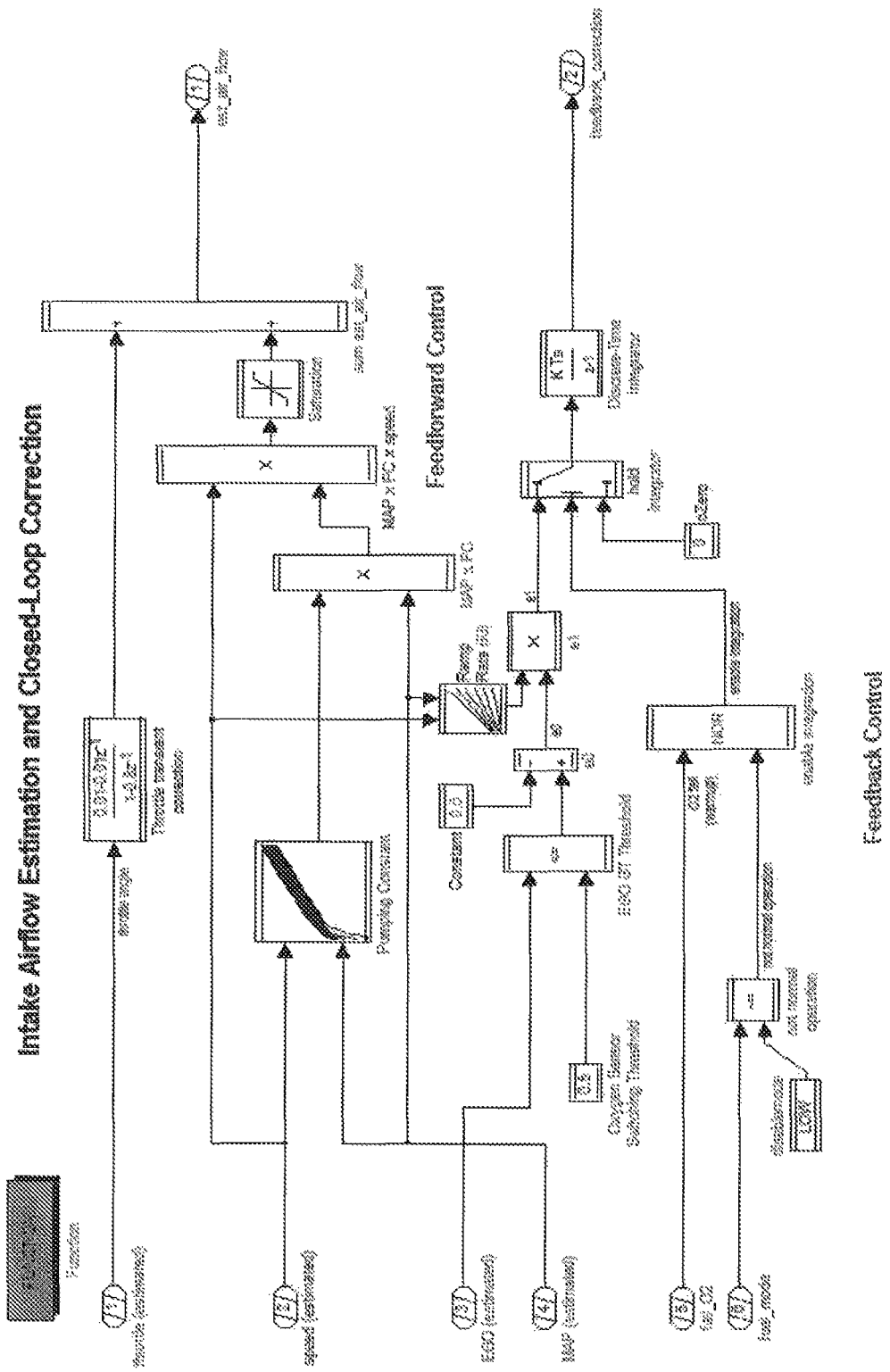
FIG. 6 shows another embodiment of the present invention, with 6 input signals and their respective processing, represented by corresponding blocks, resulting in two output signals.

FIG. 6 shows another preferred embodiment. By way of example, the model for a circuit for ascertaining an estimated air flow is shown, as well as an associated correction circuit. Regardless of the precise mode of operation, six input signals in all are used, which are processed to produce two output signals after passing through multiple processing units. In this example, all six input signals are not required for ascertaining each of the two output signals. The number and function of the input and output signals and of the blocks are chosen by way of example here, and can be replaced by any other combination desired.

By selecting one of the two output signals, for example the signal est_air_flow, the representation of the depicted model can be reduced to the blocks that actually influence the signal est_air_flow. Selecting the input signals is likewise possible, but is likely to be less relevant in practice. The resultant representation is reproduced in FIG. 7. Only three of the total of six input signals shown in FIG. 6 can influence the output signal est_air_flow, with the paths passing through different numbers of processing units. These three input signals are retained in the reduced representation and permit simplified tracing of the signal path along the relevant processing units.

The development device permits a further simplification of the representation, in which only the number of processing units passed through along the signal path is indicated in the form of a numeral next to the input signals relevant for an output signal. In the event that a signal path has no alternatives, only one numeral is written on the path. This is the case for the input signal throttle in FIG. 7, for example, which passes through the processing units throttle transient correction and sum est_air_flow. The further simplification of the representation is shown in FIG. 7, where the top path for the input signal 1 is labeled only with the number 2 to indicate that the input signal must pass through exactly 2 processing units on its way to the output signal.

Figure 7:
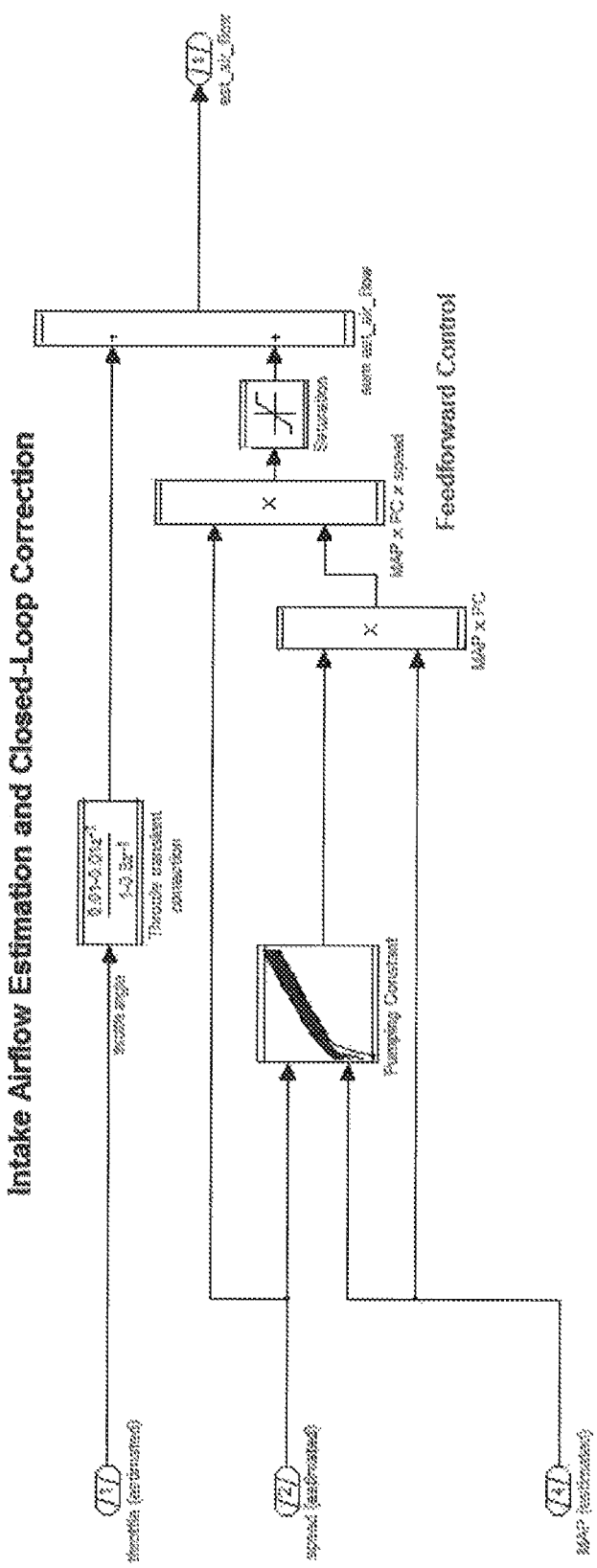
FIG. 7 shows the embodiment from FIG. 6, wherein the representation is reduced to all relevant blocks influencing a selected signal.
Figure 8:
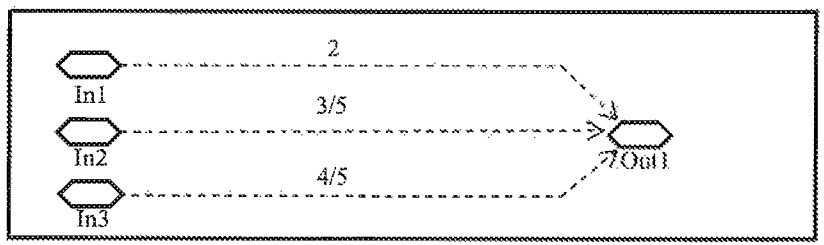
FIG. 8 shows an embodiment of the present invention, wherein a simplified representation of the development device from FIG. 7 is shown which is limited to simple lines between input and output signals, and only the number of processing units that are passed through on the signal path is indicated for the applicable line.

The situation is different for the signal speed from FIG. 7. At the first node point, this signal can either be routed directly to the function block MAP×PC×speed, and then passes through two additional processing units, or else it is first routed through the function block Pumping Constant, then through MAP×PC, and next passes through the processing units MAP×PC×speed, Saturation and sum est_air_flow. There is thus one route on which a total of three processing units are passed through, and another route on which five processing units must be passed through. Consequently, the signal path is shown with a 3 for the shorter route and with a 5 for the longer route in the further simplified representation as in FIG. 8. Similar considerations apply to the third input signal, which can be routed through either 4 or 5 processing units. Accordingly, the signal path in FIG. 8 is labeled with a 4 and a 5. If there are more than two routes through which a signal can pass, it is possible either to indicate only the minimum and maximum numbers of processing units along the possible signal paths, or to also include a list of the applicable number of processing units per possible signal path.

Figure 9:
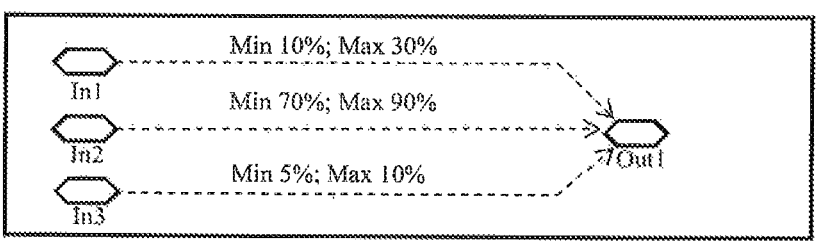
FIG. 9 shows an embodiment of the present invention, wherein a simplified representation of the development device from FIG. 7 is shown which is limited to simple lines between input and output signals, and only the minimum and/or maximum percentage influence of an input signal on an output signal is indicated for the applicable line.

FIG. 9 shows an alternative further simplification for displaying a system model. Instead of the number of processing units to be passed through for each possible signal path, the minimum and/or maximum influence of an input signal on a certain output signal is indicated with the corresponding signal path. The influence of an input signal on the output signal can be different at different sampling times. Consequently, the first number reflects the minimum influence of an applicable input signal on the output signal at a certain sampling time, and the second number accordingly reflects the maximum influence at a different sampling time. It is likewise possible to determine the sampling times in advance and to indicate the associated influence values together with the simple signal line.

Figure 10A:
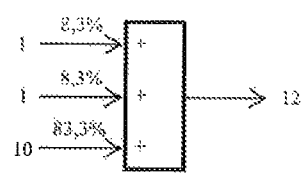
FIG. 10a and FIG. 10b show two possible methods for calculating the percentage influence of the input signals on a common output signal.
Figure 10B:
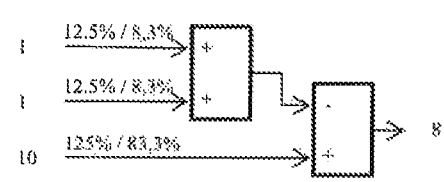

The calculation of the degree of influence of an input signal on an output signal can be carried out by the means that the applicable signal path and the processing units located thereon are viewed as a black box and only the input signal (multiplied by one hundred) is divided by the output signal. In the case of the circuit in FIG. 10a, this method would result in the following values for the percentage influence: 8.3% for the two top signals of amplitude 1 and 83.3% for the bottom signal of amplitude 10. The same calculation method applied to the nested circuit from FIG. 10b would result in a value of 12.5% for the two upper signals of amplitude 1 and 125% for the bottom signal of amplitude 10. Alternatively, one could resolve the nesting ahead of time by replacing the subtraction with an addition. In this case, the same dependence as in Figure Xa would result.

In order to ascertain the degree of influence of individual input signals on output signals, there is a functionality that automatically extracts the selected part of the signal path and supplies the input with a stimulus signal in order to feed signals in. MIL/SIL/PIL simulations are then carried out for this extracted system, and in this way the average difference quotient $\Delta Output/\Delta Input\_i$ is estimated, which is considered the "degree of influence" of Input_i on the output signal Output.

In addition to a representation of the degree of influence as a (percentage) number on a simple line, the representation can also take place such that a specific color configuration or width is used for the representation of the corresponding signal line. This representation also permits an easy-to-understand relative indication of the applicable signal amplitudes in the non-reduced model view.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A development device for configuring a model of a technical system to represent signal paths for configuring a model of a technical system on a computer with a display,
   wherein the development device is configured to cause the display to display the model with at least two signal paths of the technical system and, in an initial representation, all input signals, output signals, and all processing units in the form of block elements in a circuit diagram,
   wherein the development device is configured to execute a simulation of the model and to determine signal paths on each of the input signals, the output signals, and the processing units,
   wherein the development device is configured to receive a selection of at least one of an input signal, an output signal or a processing unit via a user interface,
   wherein, based on a result of the simulation of the model and the selection of the at least one of an input signal, an output signal or a processing unit, the development device is configured to identify a signal path that passes through the selected at least one of the input signal, the output signal and the processing unit and to reduce the representation of the model to the signal path to simple lines and to indicate a number of the processing units through which the signal passes along the signal path with the reduced representation,
   wherein only the relevant processing units are displayed or highlighted on the display.

2. The development device according to claim 1, wherein the model has a plurality of hierarchical levels and the development device makes a specific number of levels selectable for the representation of the technical system.

3. The development device according to claim 2, wherein in the case of reduced representation of the model to the selected signal path, all relevant processing units are represented in a predetermined level.

4. The development device according to claim 1, wherein the development device is additionally configured to display one or more signal profiles of a given signal along a signal path within the depicted system.

5. The development device according to claim 1, wherein the development device is additionally configured to ascertain and indicate the degree of influence of an input signal on an output signal.

6. The development device according to claim 5, wherein the specification of the degree of influence is accomplished by appropriate configuration of an applicable signal path, in particular through an appropriate color configuration of the signal path or an appropriate line width.

7. The development device according to claim 5, wherein the specification of the degree of influence is accomplished by appropriate percentage specification at an applicable signal path.

8. A development device for configuring a model of a technical system to represent signal paths for configuring a model of a technical system on a computer with a display,
   wherein the development device is configured to cause the display to display the model with at least two signal paths of the technical system and, in an initial representation, all input signals, output signals, and all processing units in the form of block elements in a circuit diagram,
   wherein the development device is configured to execute a simulation of the model and to determine signal paths on each of the input signals, the output signals, and the processing units,
   wherein the development device is configured to receive a selection of at least one of an input signal, an output signal or a processing unit via a user interface,
   wherein, based on a result of the simulation of the model and the selection of the at least one of an input signal, an output signal or a processing unit, the development device is configured to identify a signal path that passes through the selected at least one of the input signal, the output signal and the processing unit and to reduce the representation of the model to the signal path,
   wherein only the relevant processing units are displayed or highlighted on the display, and
   wherein the development device is additionally configured to ascertain and indicate the degree of influence of an input signal on an output signal.

9. The development device according to claim 8, wherein the specification of the degree of influence is accomplished by appropriate configuration of an applicable signal path, in particular through an appropriate color configuration of the signal path or an appropriate line width.

10. The development device according to claim 8, wherein the specification of the degree of influence is accomplished by appropriate percentage specification at an applicable signal path.

* * * * *